(12) United States Patent
Zhou

(10) Patent No.: US 7,046,041 B1
(45) Date of Patent: May 16, 2006

(54) STRUCTURES AND METHODS OF IMPLEMENTING A PASS GATE MULTIPLEXER WITH PSEUDO-DIFFERENTIAL INPUT SIGNALS

(75) Inventor: Shi-dong Zhou, Milpitas, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 11/235,898

(22) Filed: Sep. 27, 2005

Related U.S. Application Data

(62) Division of application No. 10/796,330, filed on Mar. 9, 2004.

(51) Int. Cl.
*H03K 19/0175* (2006.01)

(52) U.S. Cl. ............................. 326/113; 326/37; 326/41
(58) Field of Classification Search .................. 326/37, 326/41, 47, 113
See application file for complete search history.

(56) References Cited

U.S. PATENT DOCUMENTS

| 6,084,437 | A | 7/2000 | Sako |
|---|---|---|---|
| 6,121,797 | A | 9/2000 | Song et al. |
| 6,232,799 | B1 | 5/2001 | Allen et al. |
| 6,621,296 | B1 * | 9/2003 | Carberry et al. ............... 326/40 |
| 6,768,338 | B1 | 7/2004 | Young et al. |

* cited by examiner

*Primary Examiner*—Anh Q. Tran
(74) *Attorney, Agent, or Firm*—Lois D. Cartier

(57) ABSTRACT

Pseudo-differential multiplexer circuits and methods. The circuit input signals are provided to two similar multiplexers, one of which is driven by true signals and one by the complementary input signals. No matter what the values of the circuit input signals, at least one of the two multiplexers always selects a low value. Therefore, at least one of the two multiplexers has the capability of overcoming a value stored in an output circuit (e.g., a latch) coupled to the output terminals of the two multiplexers. Thus, even when neither multiplexer can provide a high signal at the full value of power high VDD, the output circuit provides the correct output value. The invention also encompasses methods of selecting between circuit input signals by utilizing a pseudo-differential multiplexing technique, e.g., utilizing multiplexer circuits similar to those described above.

12 Claims, 12 Drawing Sheets

STRUCTURES AND METHODS OF IMPLEMENTING A PASS GATE MULTIPLEXER WITH PSEUDO-DIFFERENTIAL INPUT SIGNALS

FIELD OF THE INVENTION

The invention relates to multiplexer circuits. More particularly, the invention relates to multiplexer circuits that utilize pseudo-differential input signals.

BACKGROUND OF THE INVENTION

Multiplexer circuits are very common in integrated circuits (ICs) and other electronic circuits. For example, multiplexer circuits are used throughout many programmable logic devices (PLDs), such as field programmable gate arrays (FPGAs) and complex programmable logic devices (CPLDs), to programmably select one of several different input signals to pass to a logic destination, or to select one of several stored values to provide as the output signal from a lookup table (LUT). Therefore, multiplexers can form a significant portion of the logic circuitry in a PLD. Hence, reducing the power dissipation and/or the leakage current of these multiplexers can significantly improve the overall performance of an electronic device in these increasingly important areas.

FIG. 1 illustrates a well known 8-to-1 binary multiplexer circuit. A similar multiplexer circuit is commonly included in FPGA LUTs, for example, although LUTs typically have 16 input signals. The choice of eight input signals for the various multiplexer circuits illustrated herein is purely exemplary. Multiplexer circuits often have fewer or more than eight input signals. The drawings herein are standardized on 8-to-1 multiplexer circuits simply to simplify the drawings and to provide a common standard for comparison purposes. Multiplexer circuits having different numbers of input signals are easily extrapolated from the illustrated examples by those of skill in the relevant arts.

The circuit of FIG. 1 includes 8 input terminals IN0–IN7, three select terminals S0–S2, an output terminal OUT, N-channel transistors 100–107, 110–113, and 120–121, inverters 141–143, and half-latch 130. Half-latch 130 includes inverter 131 and pullup 132. (In the present specification, the same reference characters are used to refer to terminals, signal lines, signal nodes, and their corresponding signals.)

A high value on select signal S0 passes signals IN7, IN5, IN3, and IN1 to internal nodes INT3, INT2, INT1, and INT0, respectively. A low value on select signal S0 is inverted by inverter 141 to provide a high signal that passes signals IN6, IN4, IN2, and IN0 to internal nodes INT3, INT2, INT1, and INT0, respectively. A high value on select signal S1 passes signals INT3 and INT1 to internal nodes INT5 and IN4, respectively. A low value on select signal S1 is inverted by inverter 142 to provide a high signal that passes signals INT2 and INT0 to internal nodes INT5 and INT4, respectively. A high value on select signal S2 passes signal INT5 to internal node INT6. A low value on select signal S2 is inverted by inverter 143 to provide a high signal that passes signal INT4 to internal node INT6.

A low value on internal node INT6 is inverted by inverter 131 and provides a high value (power high VDD) at the output terminal OUT. However, an N-channel transistor passes a high value with a voltage drop of one N-channel threshold voltage vth from the gate voltage. Therefore, a high value passed to node INT6 equals not power high VDD, but VDD-Vth. At today's low operating voltages, this reduced high value may not fully turn off the pullup, or turn on the pulldown, included in inverter 131. Therefore, pullup 132 is provided on internal node INT6 to pull the node fully to VDD whenever output terminal OUT reaches a sufficiently low value to turn on the pullup. Thus, inverter 131 functions properly and leakage through the inverter is reduced.

The circuit of FIG. 1 works well with sufficiently high values of VDD. As long as the voltage level VDD-Vth is high enough to flip inverter 131 and turn on pullup 132, the circuit functions properly. However, power high voltage levels (VDD) are much lower in today's ICs than was previously the case. For example, when VDD=1.2 volts and Vth=0.5 volts, a voltage level of VDD−Vth=0.7 volts cannot be relied upon to flip inverter 131.

Various methods have been used to resolve this problem. One known method is to use a gate voltage higher than VDD when driving a high value onto the gates of N-channel transistors 100–107, 110–113, and 120–121 (i.e., signals S0–S2 and inverters 141–143 are implemented using a "pumped" power high voltage greater than VDD). For example, if the gate voltage is higher than VDD by one threshold voltage Vth, the resulting voltage at node INT6 is (VDD+Vth−Vth), or simply VDD. Another approach is to lower the threshold voltage of N-channel transistors 100–107, 110–113, and 120–121. However, each of these solutions complicates the fabrication of the circuit, especially at very short gate lengths. These solutions are becoming less viable as IC gate lengths become shorter and shorter, and VDD values lower and lower, with the passage of time.

An alternative solution to this problem is presented in FIG. 2. As previously described, an N-channel transistor passes only a "degraded" (e.g., reduced) version of a high voltage value. However, a P-channel transistor passes high voltage values with no voltage degradation. Therefore, the voltage degradation can be eliminated by replacing the N-channel transistors with CMOS passgates, each of which includes a pair of N-channel and P-channel transistors coupled in parallel. The P-channel transistor is gated by the inverse signal of the associated N-channel transistor. The N-channel transistor provides a fast response to a high input signal, while the P-channel transistor pulls a high output value fully "to the rail", i.e., all the way to VDD.

The multiplexer circuit of FIG. 2 is similar to the circuit of FIG. 1, except that N-channel transistors 100–107, 110–113, and 120–121 are replaced by CMOS pass transistors 200–207, 210–213, and 220–221. The N-channel transistors are gated by the same signals as in FIG. 1, and the P-channel transistors are gated by the inverted signals. Components unchanged from those of FIG. 1 are similarly numbered, and are not again described.

Note that the pullup 132 of FIG. 1 is not needed in the circuit of FIG. 2, because a high value provided to node INT6 already has the full value of VDD.

However, the circuit of FIG. 2 also has its drawbacks. For example, a matrix of passgates that includes both N-channel and P-channel transistors (as in the circuit of FIG. 2) requires more than twice as much area to implement within an IC. This limitation is partially due to the fact that P-channel transistors are placed within an N-well in the substrate. The N-well consumes additional area, both in itself and in the extra spacing required to isolate the N-well from the N-channel transistors. Additionally, a P-channel transistor must be made about twice as wide as an N-channel transistor to provide the same speed of operation. Therefore, each P-channel transistor consumes much more area than the associated N-channel transistor.

Therefore, it is desirable to provide multiplexer circuits and methods that pass a full high value (i.e., VDD) to the circuit output node, but do not unduly complicate the fabrication process, and which consume less area than the CMOS solution illustrated in FIG. 2.

SUMMARY OF THE INVENTION

The invention provides pseudo-differential multiplexer circuits and methods. The circuit input signals are provided to two similar multiplexers, one of which is driven by true signals and one by the complementary input signals. In some embodiments, the complementary input signals are strict inversions of the circuit input signals, wherein each complementary input signal always has an opposite value to the corresponding circuit input signal. In other embodiments, a given value (e.g., a high value) on a circuit input signal always forces another value (e.g., a low value) on the corresponding complementary input signal. However, another value (e.g., a low value) on the circuit input signal has no effect on the corresponding complementary input signal.

No matter what the values of the circuit input signals, at least one of the two multiplexers always selects a low value. Therefore, at least one of the two multiplexers has the capability of overcoming a value stored in an output circuit (e.g., a latch) coupled to the output terminals of the two multiplexers. Thus, even when neither multiplexer can provide a high signal at the full value of power high VDD, the output circuit provides the correct output value.

Therefore, the invention enables the use of multiplexers that include only N-channel transistors in the signal paths between the data input and output terminals, even at very low operating voltages. Power dissipation and leakage current are also lower than is normally achieved using traditional multiplexer circuits. Additionally, the layout area required to implement the resulting structures is less than is required for traditional CMOS implementations.

The invention also encompasses methods of selecting between circuit input signals by utilizing a pseudo-differential multiplexing technique, e.g., utilizing multiplexer circuits similar to those described above.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 3:
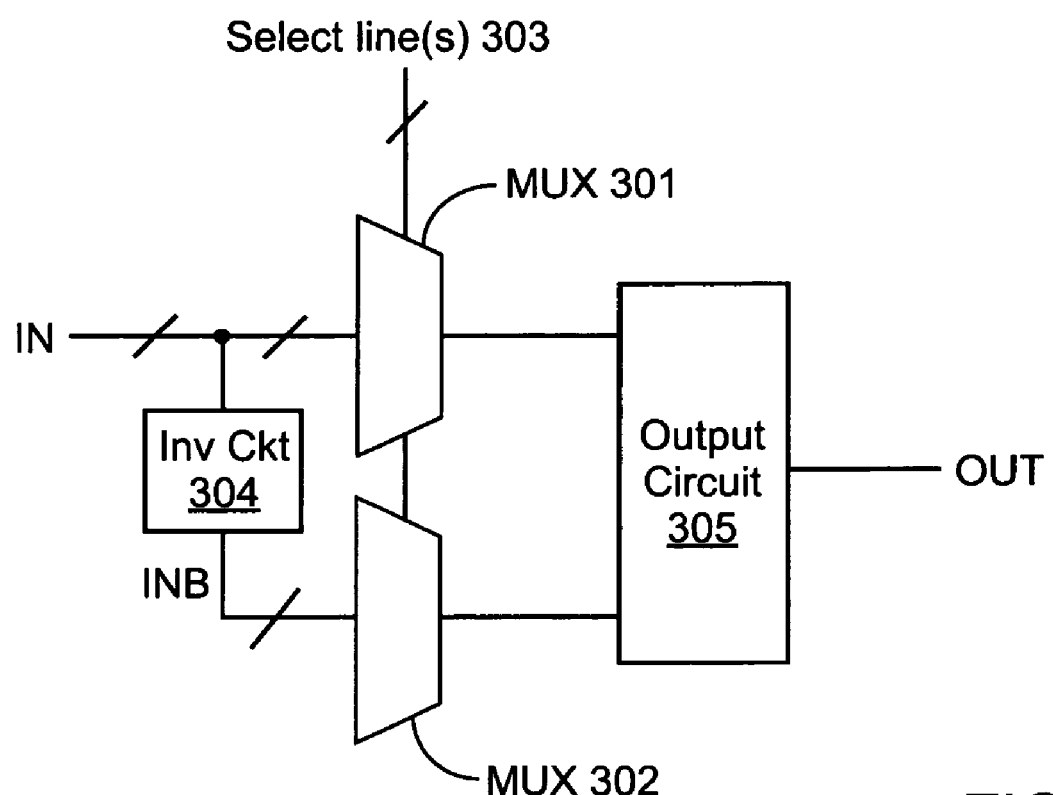
FIG. 3 is a block diagram illustrating a pseudo-differential multiplexer circuit according to an embodiment of the present invention.

FIG. 3 is a block diagram of a pseudo-differential multiplexer circuit according to one aspect of the present invention. The circuit includes two multiplexers (MUX 301, 302), an inversion circuit 304 coupled between the input terminals of the two multiplexers, and an output circuit coupled to the output terminals of the two multiplexers. (Inversion circuit 304 can also be considered as including two or more smaller inversion circuits, one inversion circuit being coupled between each corresponding pair of input terminals in the two multiplexers.) The first multiplexer 301 and the inversion circuit are driven by a plurality of circuit input signals IN. (The slash mark across the IN signal line in FIG. 3 indicates that the line includes two or more input signals.) Both multiplexers are controlled by select line or lines 303. Output circuit 305 provides signal OUT, an output signal for the pseudo-differential multiplexer circuit.

Figure 9:
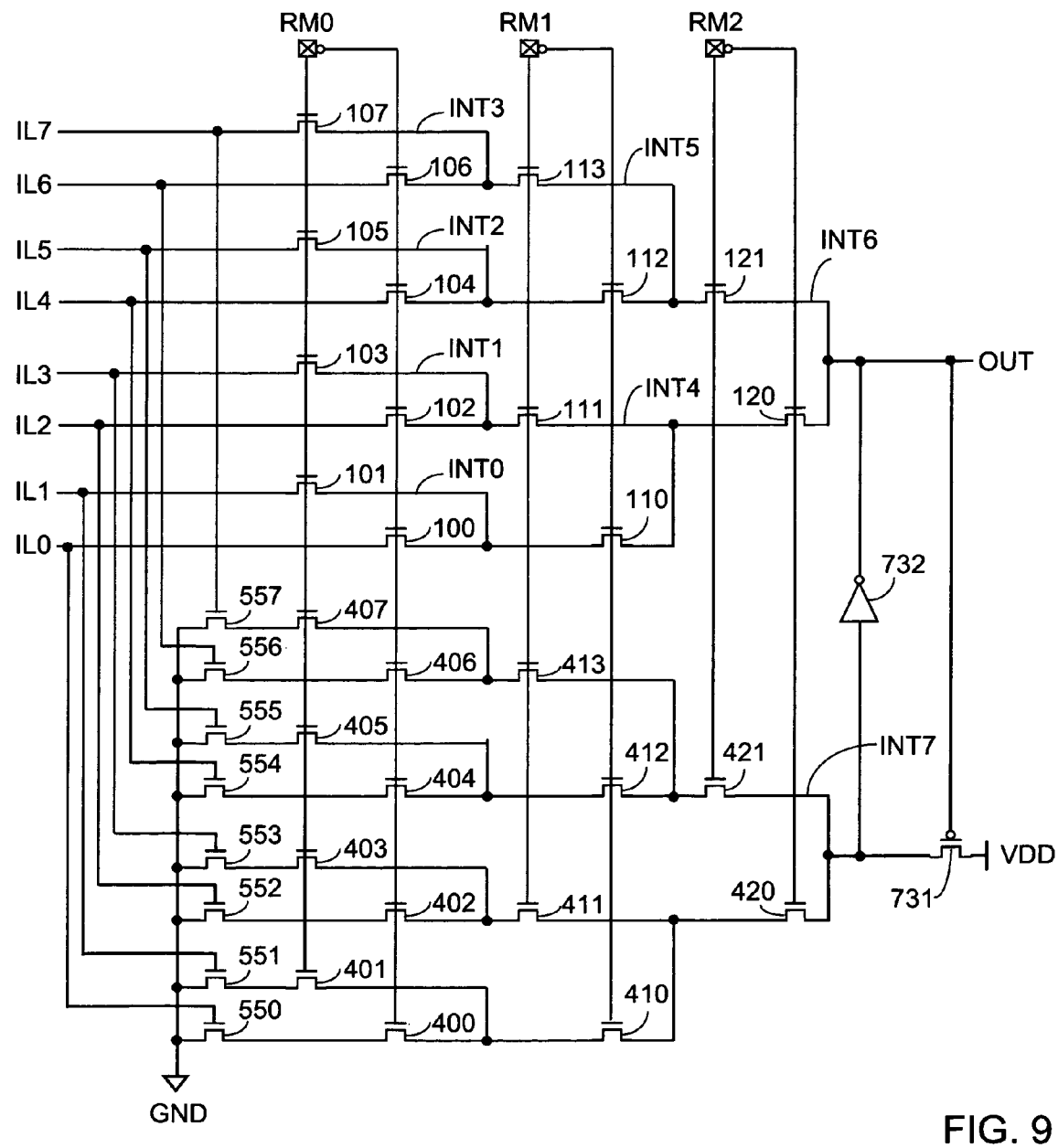
FIG. 9 schematically illustrates an FPGA routing multiplexer utilizing a pseudo-differential binary multiplexer circuit according to one embodiment of the present invention.
Figure 10:
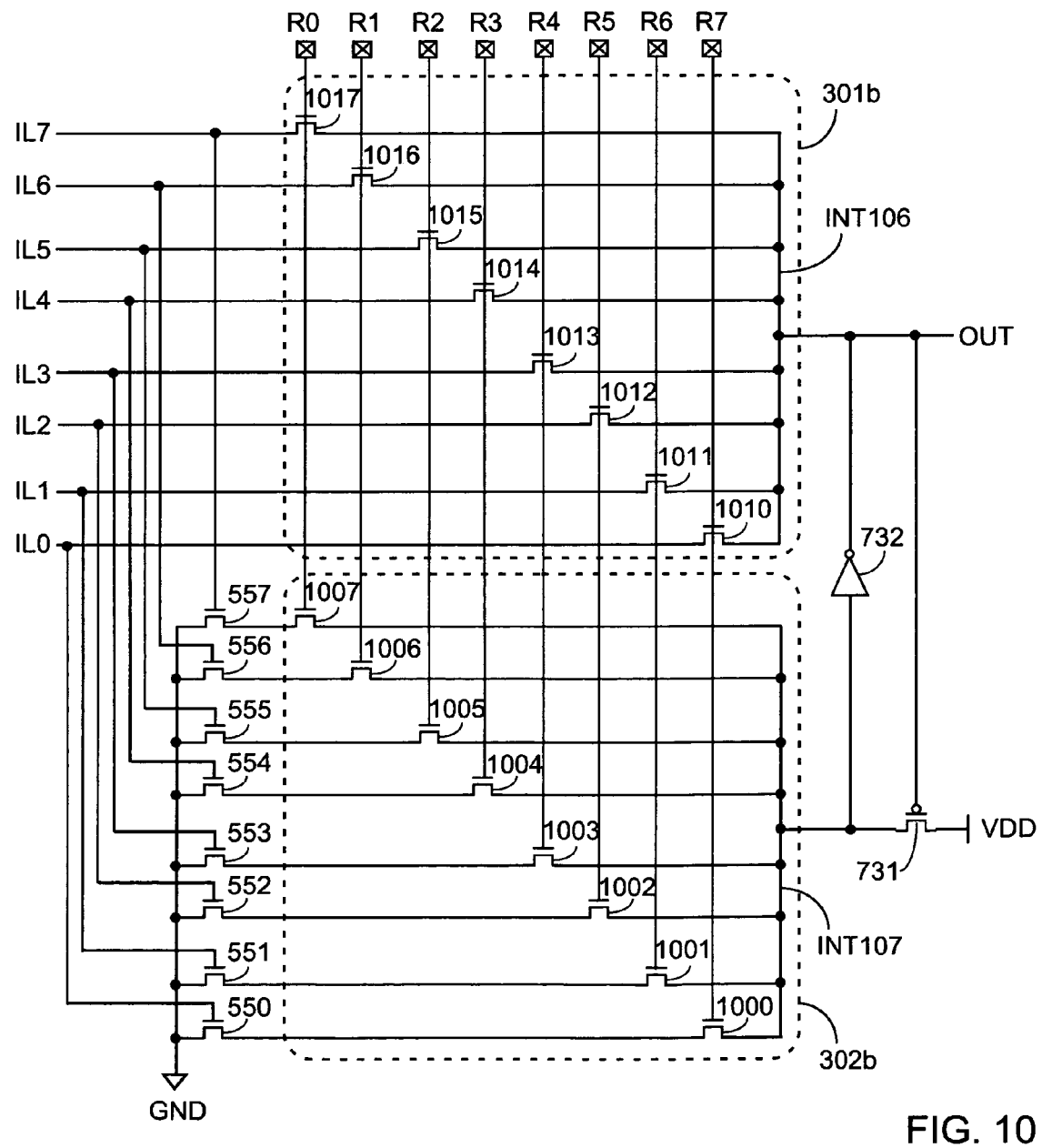
FIG. 10 schematically illustrates an FPGA routing multiplexer utilizing a pseudo-differential one-hot multiplexer circuit according to one embodiment of the present invention.

Multiplexers 301 and 302 can be, for example, binary multiplexers (e.g., as shown in FIGS. 4–7, 9, and 11), or one-hot multiplexers (e.g., as shown in FIG. 10). Other multiplexer embodiments can also be used. Maximum benefit is derived from the invention when the multiplexers include only N-channel transistors on each path between the input terminals and the output terminal of each multiplexer. Importantly, the select terminals of the two multiplexers are coupled such that the two multiplexers are configured to select a corresponding one of their respective input signals in response to equivalent signals received at their respective select input terminals.

Figure 11:
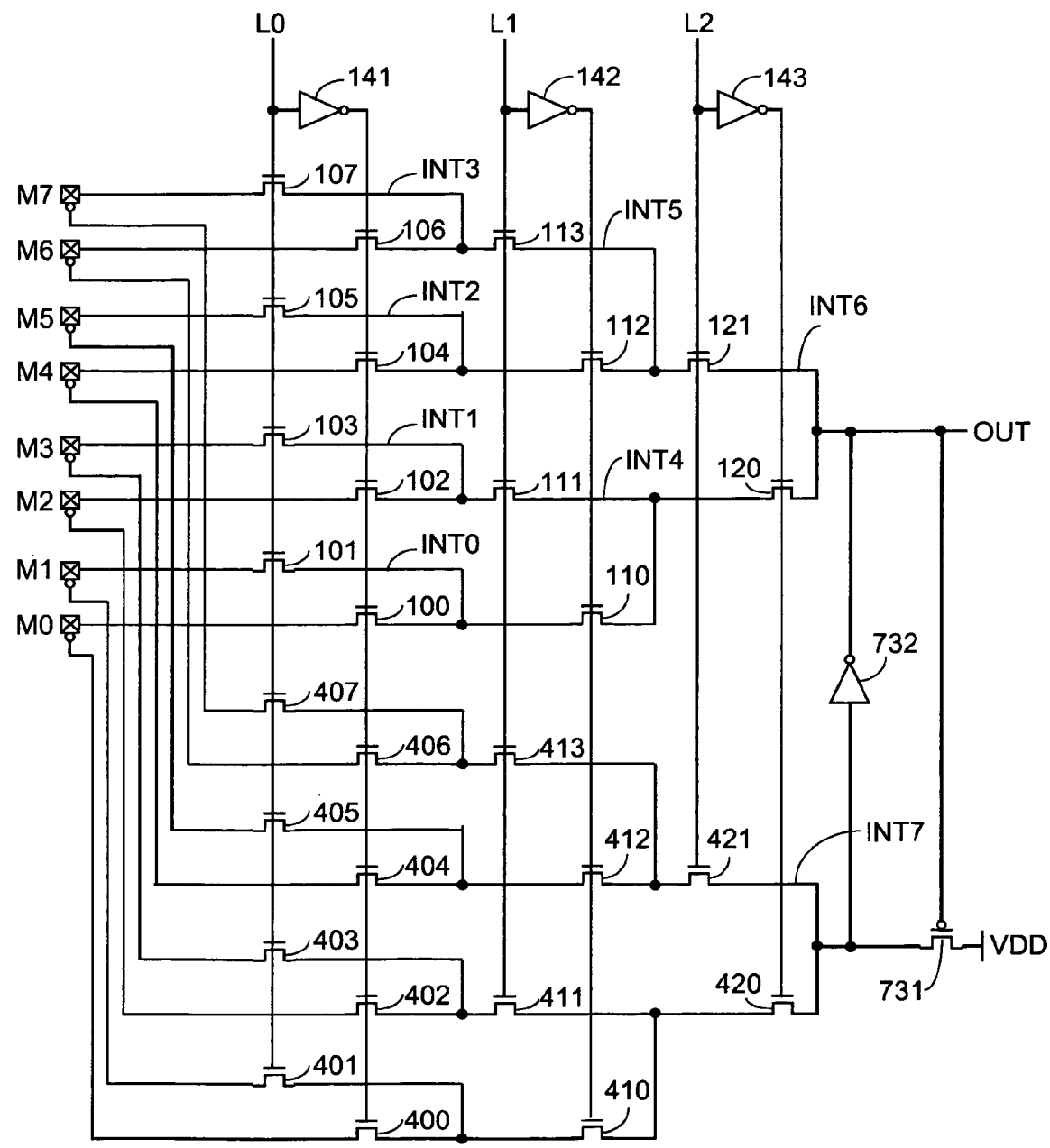
FIG. 11 schematically illustrates an FPGA lookup table (LUT) utilizing a pseudo-differential binary multiplexer circuit according to one embodiment of the present invention.

Inversion circuit 304 can be implemented, for example, as an inverter coupled between each pair of multiplexer input terminals (e.g., as in the embodiment of FIG. 4), or as part of a memory cell providing true and complement output signals (as in the embodiment of FIG. 11). In these embodiments, the complementary input signals driving multiplexer 302 are strict inversions of the corresponding circuit input signals driving multiplexer 301. (In other words, each complementary input signal always has an opposite value to the corresponding circuit input signal.) In some embodiments, inversion circuit 304 is implemented as a pulldown gated by the corresponding circuit input signal (e.g., as in the embodiments of FIGS. 5–7 and 9–10). Thus, a high value is converted to a low value, but a low value is ignored. This is sufficient when the purpose of the second multiplexer is simply to provide a strong low value when the selected circuit input signal is high. Omitting the unnecessary pullups on the input terminals of the second multiplexer saves layout area for the circuit. Inversion circuit 304 can also be implemented in other ways (not shown).

Output circuit 305 can also be implemented in various ways, as shown in the various examples illustrated herein. Output circuit 305 can also be implemented in other ways (not shown). No matter what the values of the circuit input signals, at least one of the two multiplexers always provides a low value. Therefore, there is no need for a reduced high value (VDD-Vth) to flip an inverter in the output circuit.

Figure 4:
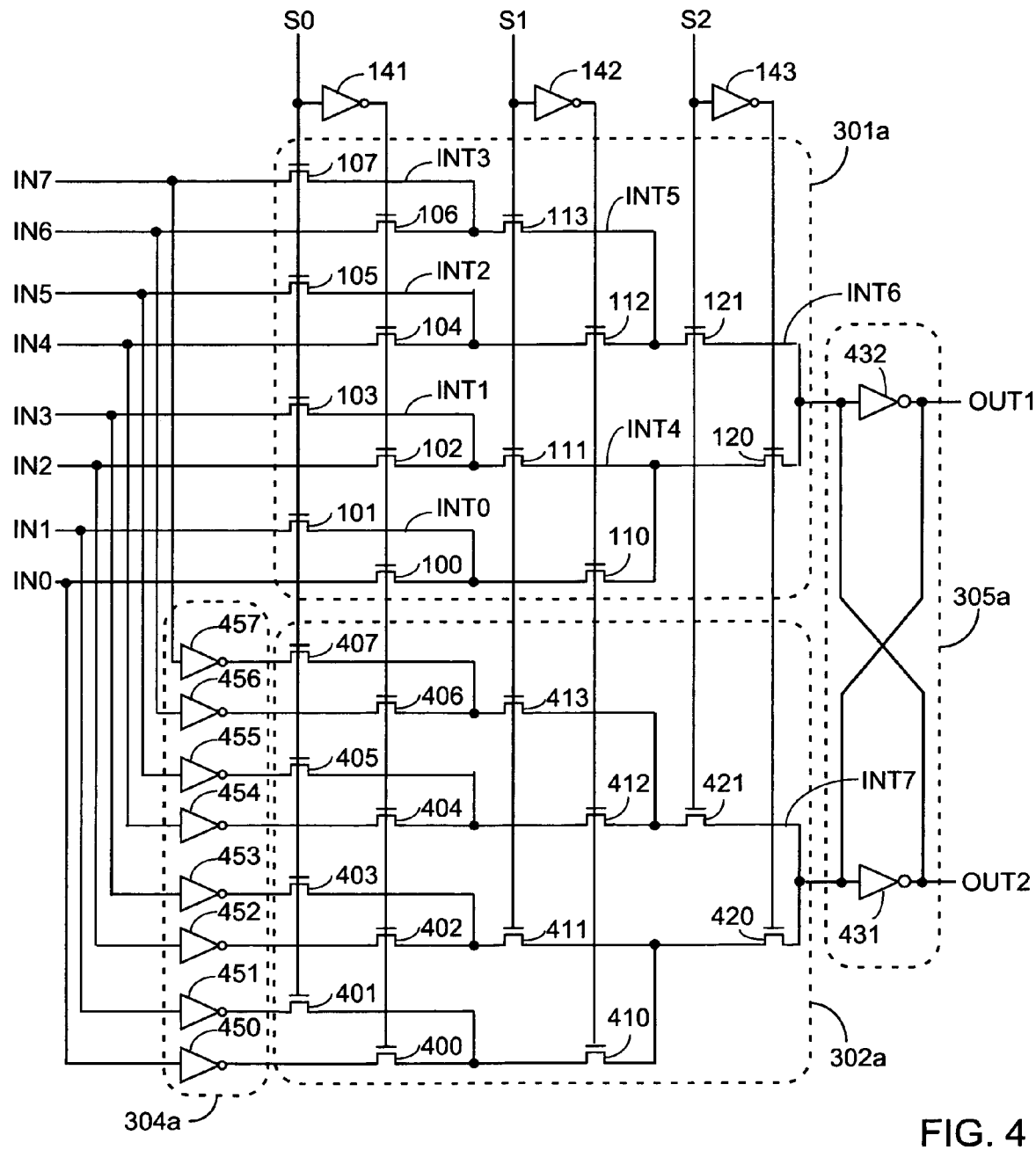
FIG. 4 schematically illustrates a first multiplexer circuit according to an embodiment of the present invention.

FIG. 4 illustrates a first embodiment of the pseudo-differential multiplexer circuit of FIG. 3. Multiplexer 301 is implemented as a standard binary multiplexer 301a, as described in connection with FIG. 1, and provides signal INT6. Multiplexer 302 is implemented as another standard binary multiplexer 302a and includes N-channel transistors 400–407, 410–413, and 420–421, coupled together in the same fashion as N-channel transistors 100–107, 110–113, and 120–121, respectively. Multiplexer 302a provides signal INT7. The select terminals of the two multiplexers are driven by select signals S0–S2 and inverters 141–143, as in the circuit of FIG. 1.

Inversion circuit 304 is implemented as shown in circuit 304a, which includes eight inverters 450–457 coupled between the circuit input signals IN0–IN7 and the corresponding input terminals of multiplexer 302a.

Output circuit 305 is implemented as shown in output circuit 305a, which includes a pair of cross-coupled inverters 431 and 432. Note that either inverter can drive the output node (i.e., either signal OUT1 or signal OUT2 can provide the circuit output signal OUT shown in FIG. 3). The selection can be made, for example, based on the desired sense of the output signal. Some embodiments (not shown) include an additional inverter coupled to the selected output terminal and providing additional buffering.

Note that the voltage within multiplexers 301a and 302a is limited to the range between zero volts (ground, or GND) and VDD-Vth (one N-channel threshold below power high VDD). Because the voltage swing is smaller, for example, than in the CMOS multiplexer illustrated in FIG. 2, multiplexers 301a and 302a together have a lower power dissipation. The leakage current is also reduced relative to the circuit of FIG. 2.

Figure 5:
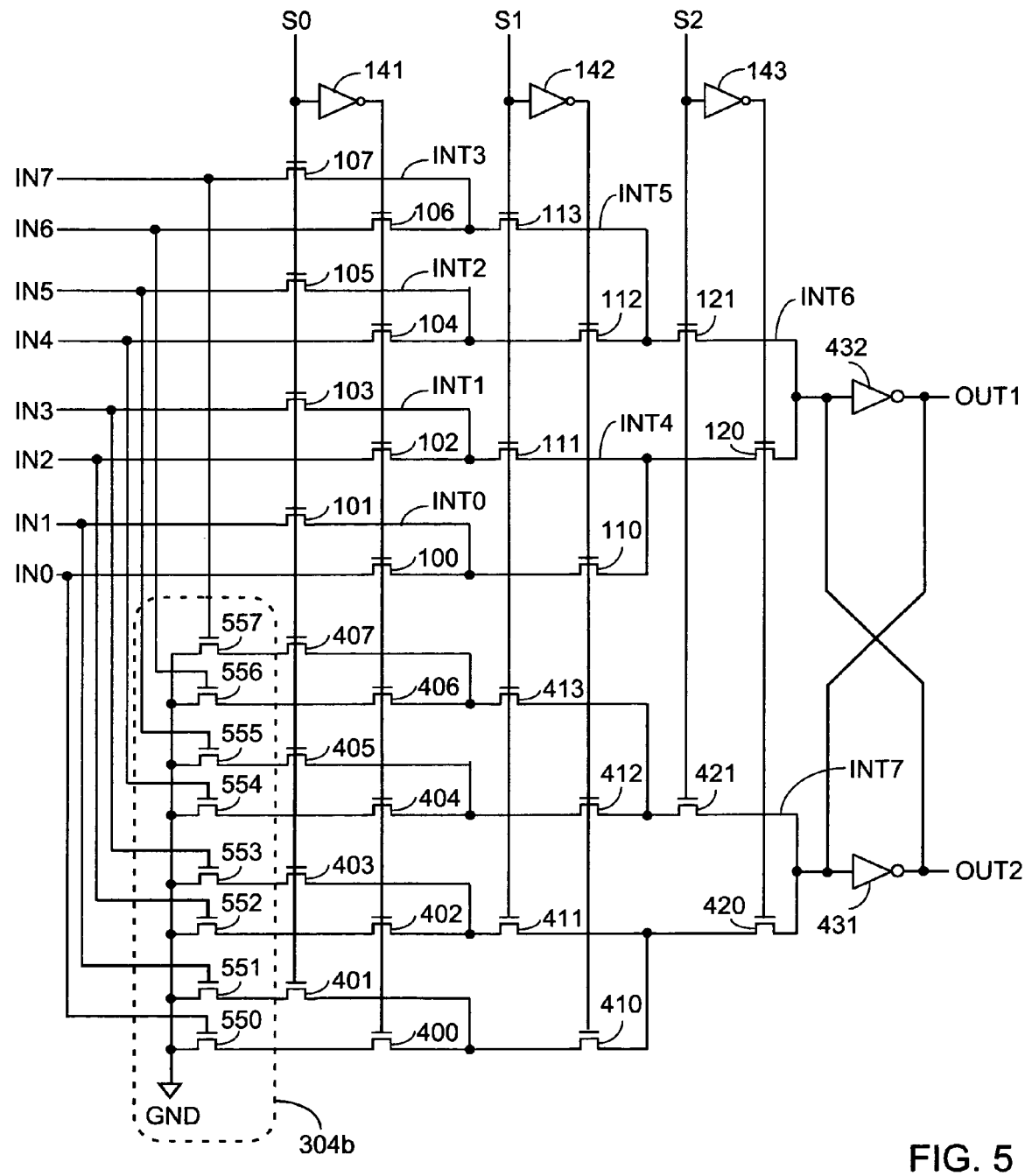
FIG. 5 schematically illustrates a second multiplexer circuit according to an embodiment of the present invention.

FIG. 5 illustrates a second embodiment of the pseudo-differential multiplexer circuit of FIG. 3. The circuit of FIG. 5 is similar to that of FIG. 4, except for the implementation of inversion circuit 304. Inversion circuit 304 of FIG. 3 is implemented as shown in circuit 304b of FIG. 5, which includes eight pulldowns 550–557 coupled between the eight multiplexer input terminals and a ground terminal GND. Thus, a high value on one of the circuit input terminals IN0–IN7 pulls down the corresponding input terminal of the second multiplexer. If that value is selected, the second multiplexer passes a low value capable of flipping inverter 431, thereby providing a high value at output terminal OUT2 and a low value at terminal OUT1.

Figure 6:
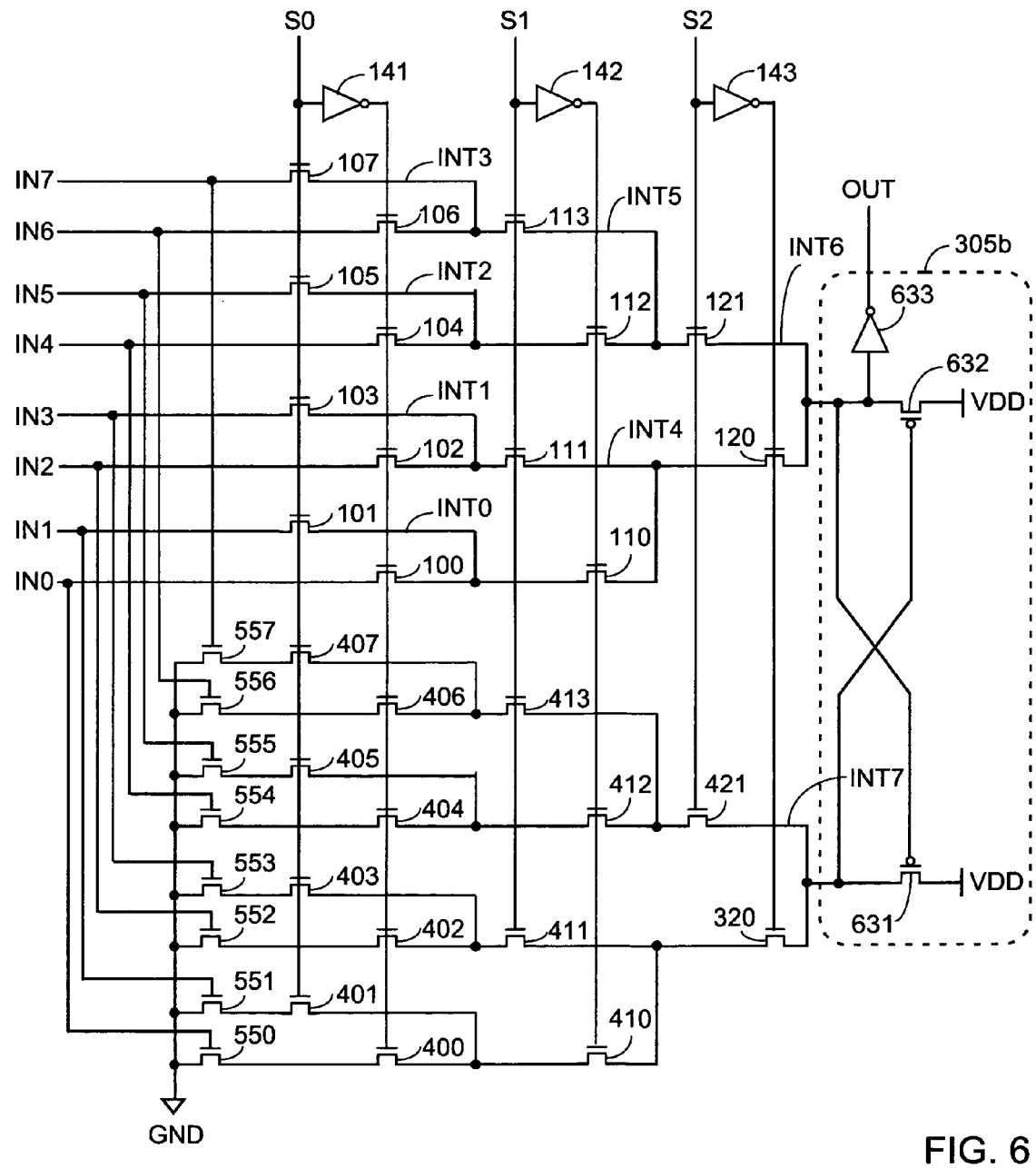
FIG. 6 schematically illustrates a third multiplexer circuit according to an embodiment of the present invention.

FIG. 6 illustrates a third embodiment of the pseudo-differential multiplexer circuit of FIG. 3. The circuit of FIG. 6 is similar to that of FIG. 5, except for the implementation of output circuit 305. Output circuit 305 of FIG. 3 is implemented as shown in circuit 305b in FIG. 6. Output circuit 305b includes an inverter 633 driven by the output INT6 of the first multiplexer and providing output signal OUT, as well as two pullups 631, 632. In the pictured embodiment, pullup 631 is a P-channel transistor coupled between the output terminal INT7 of the second multiplexer and a power high terminal VDD, and gated by the output INT6 of the first multiplexer. Pullup 632 is a P-channel transistor coupled between the output terminal of the first multiplexer and a power high terminal VDD, and gated by the output of the second multiplexer.

Figure 7:
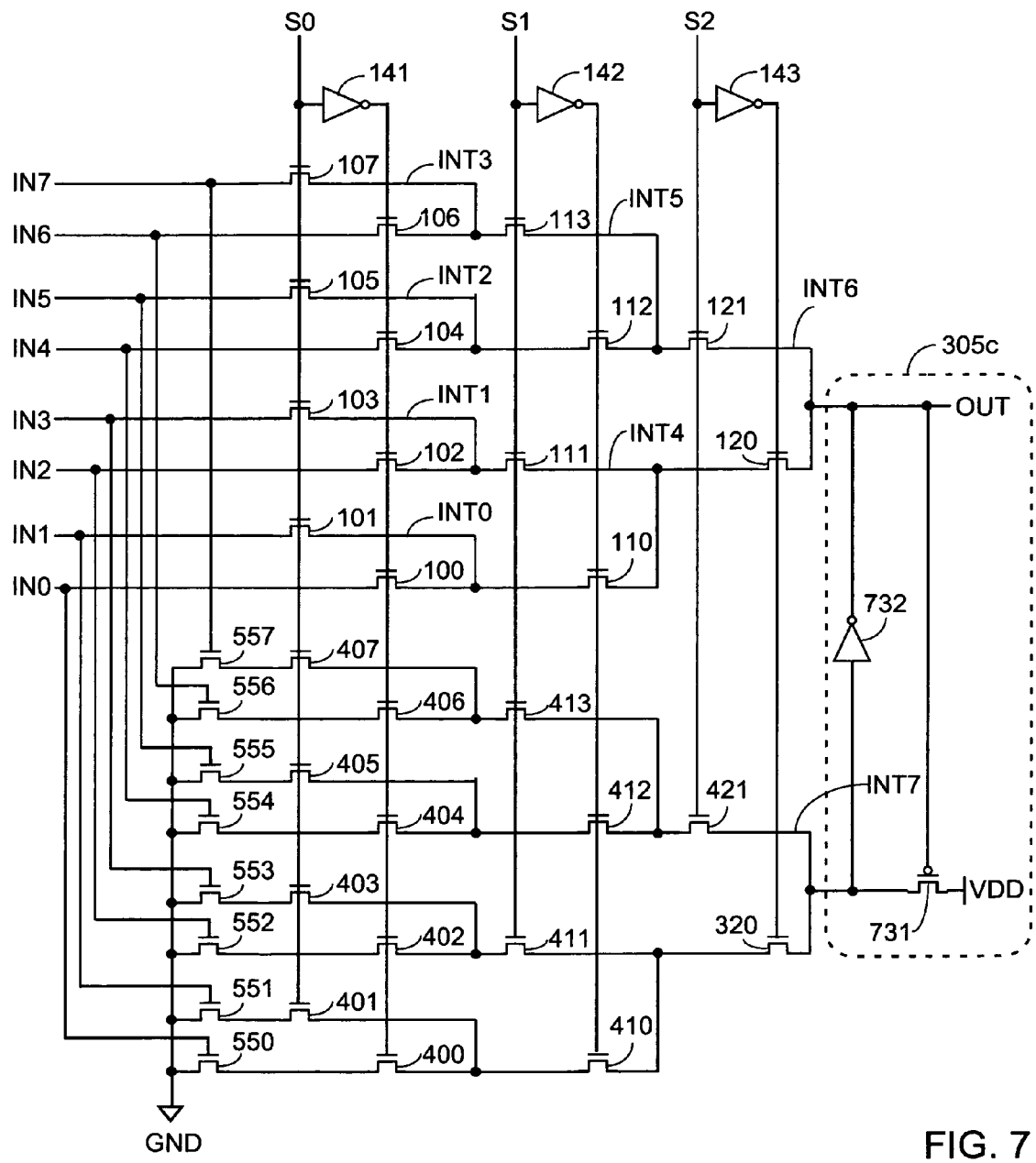
FIG. 7 schematically illustrates a fourth multiplexer circuit according to an embodiment of the present invention.

FIG. 7 illustrates a fourth embodiment of the pseudo-differential multiplexer circuit of FIG. 3. The circuit of FIG. 7 is similar to those of FIGS. 5 and 6, except for the implementation of output circuit 305. Output circuit 305 of FIG. 3 is implemented as shown in circuit 305c in FIG. 7. Output circuit 305c includes an inverter 732 having an input terminal driven by the output INT7 of the second multiplexer and an output terminal coupled to the output INT6 of the first multiplexer. Output circuit 305c also includes a pullup 731. In the pictured embodiment, pullup 731 is a P-channel transistor coupled between the output terminal INT7 of the second multiplexer and a power high terminal VDD, and gated by the output INT6 of the first multiplexer.

Figure 1:
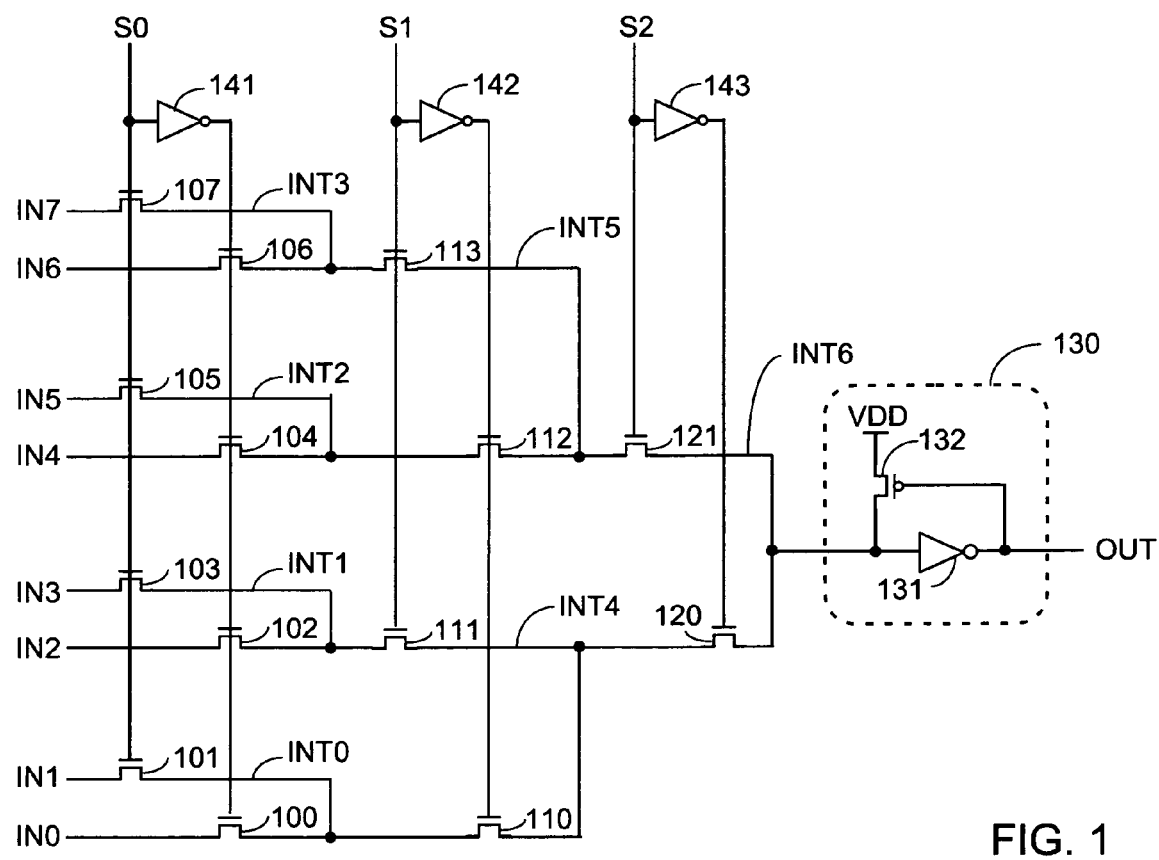
FIG. 1 schematically illustrates a well known multiplexer circuit that utilizes N-channel transistors.
Figure 2:
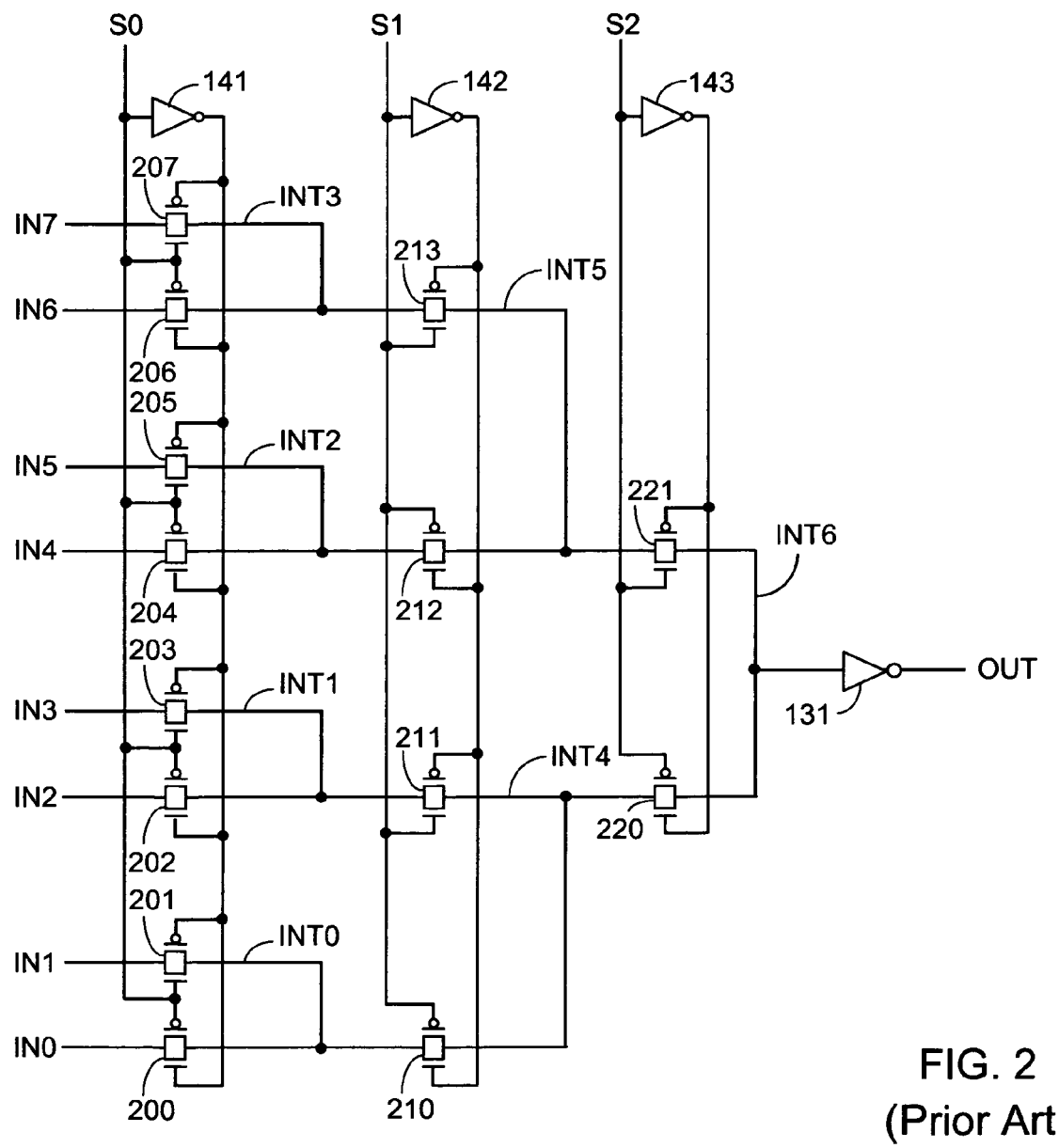
FIG. 2 schematically illustrates a well known multiplexer circuit that utilizes CMOS pass-gates.

Note that the output signals of the various multiplexer circuits illustrated herein do not always have the same sense. For example, the multiplexer circuits of FIGS. 1, 2, and 6 are inverting circuits, while the output signals from FIGS. 3–5 can be of either sense. The multiplexer circuit illustrated in FIG. 7, on the other hand, provides a non-inverted output value. However, the circuit output signals of any of the illustrated or described embodiments are easily inverted as desired by one of skill in the art.

Many electronic circuits and systems can benefit by including the pseudo-differential multiplexer circuits described herein. Circuits that can particularly benefit from the invention include, for example, programmable logic devices (PLDs), which typically include a very large number of multiplexer circuits. Programmable logic devices (PLDs) are a well-known type of integrated circuit that can be programmed to perform specified logic functions.

Figure 8:
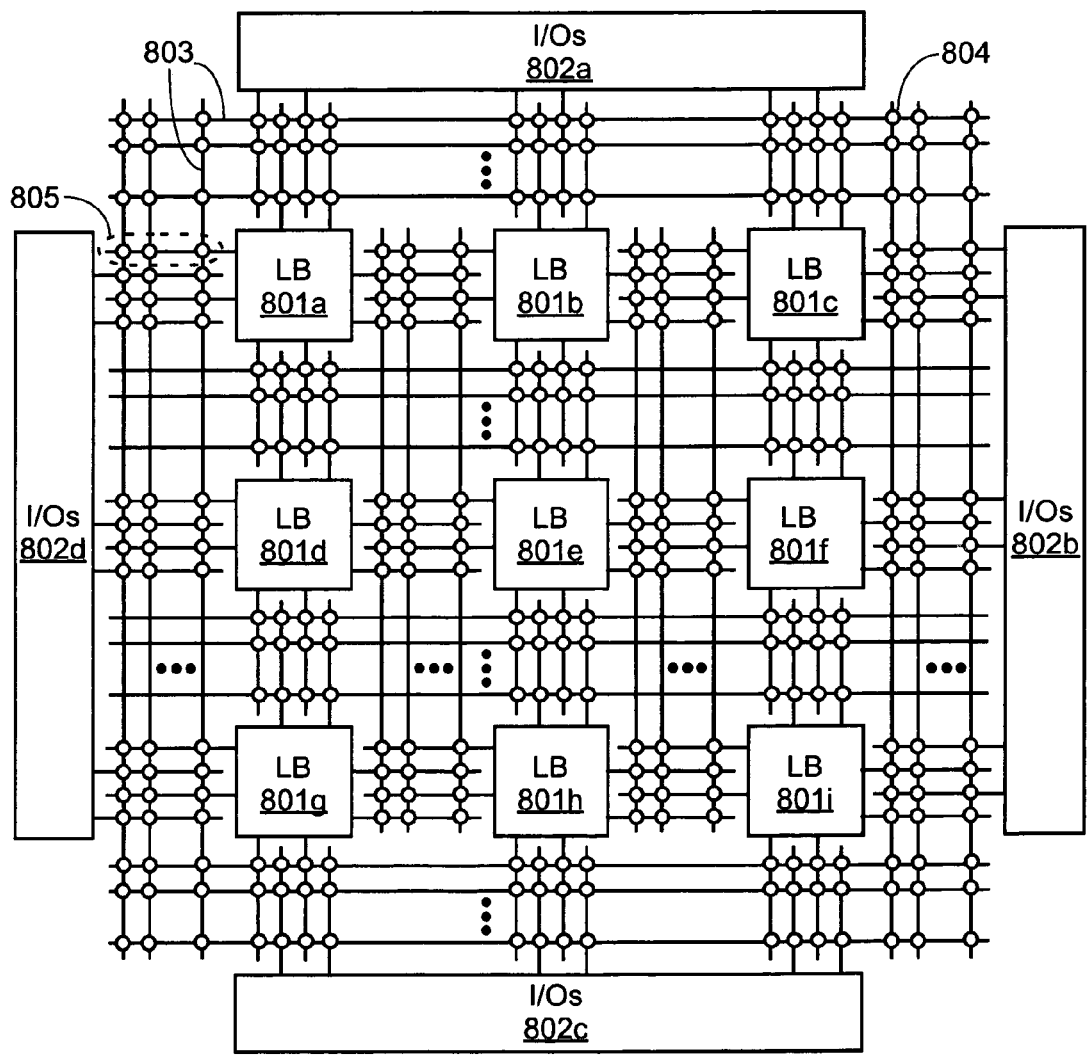
FIG. 8 illustrates a well known field programmable gate array (FPGA).

FIG. 8 is a simplified illustration of one type of PLD, the Field Programmable Gate Array (FPGA). The FPGA of FIG. 8 includes an array of configurable logic blocks (LBs 801a–801i) and programmable input/output blocks (I/Os 802a–802d). The LBs and I/O blocks are interconnected by a programmable interconnect structure that includes a large number of interconnect lines 803 interconnected by programmable interconnect points (PIPs 804, shown as small circles in FIG. 8). PIPs are often coupled into groups (e.g., group 805) that implement multiplexer circuits (routing multiplexers) selecting one of several interconnect lines to provide a signal to a destination interconnect line or logic block.

Configurable logic blocks often include lookup tables (LUT), addressable memory arrays that provide any function of a limited number of input signal values. Lookup tables are typically implemented using memory cells and a multiplexer. The memory cells store predetermined values, while the multiplexer uses the input signals to select one of the predetermined values from among the stored contents of the memory cells. For example, the multiplexer circuit of FIG. 1 can be used to implement a PLD LUT, where the input signals IN0–IN7 are provided by memory cells. A LUT typically has 16 input signals, and this larger structure is easily extrapolated from the circuit of FIG. 1 by doubling the number of input signals and adding another stage to the multiplexer circuit.

The interconnect structure and logic blocks of an FPGA are typically programmed by loading a stream of configuration data into internal configuration memory cells that define how the logic blocks and interconnect are configured. These configuration memory cells can include, for example, the memory cells described above in relation to the routing multiplexers and LUTs. The configuration data can be read from memory (e.g., an external PROM) or written into the FPGA by an external device. The collective states of the individual memory cells then determine the function of the FPGA.

FIG. 9 shows one way in which the invention can be used to implement a routing multiplexer for a PLD. The circuit of FIG. 9 can be used, for example, to implement multiplexer 805 of FIG. 8. In the embodiment of FIG. 9, the input signals are provided by eight interconnect lines IL0–IL7 included in the interconnect structure of the PLD. Three configuration memory cells RM0–RM2 provide stored values that programmably select one of the eight input signals from interconnect lines IL0–IL7. The routing multiplexer is implemented in a pseudo-differential manner similar to that of FIG. 7. Thus, both high and low values from the interconnect lines are properly passed to output node OUT irregardless of a voltage drop applied to a high signal value.

Note that the number of input signals and select signals in a PLD routing multiplexer can be the same as, smaller than, or larger than eight. In modern PLDs, for example, routing multiplexers often select from more than eight input signals. However, differently sized routing multiplexers can easily be extrapolated from the illustrated examples by one of skill in the relevant arts, as is the case for all of the exemplary circuits shown in the figures herein.

FIG. 10 illustrates another way in which the invention can be used to implement a routing multiplexer for a PLD. The circuit of FIG. 10 can be used, for example, to implement multiplexer 805 of FIG. 8. The embodiment of FIG. 10 utilizes one-hot encoding, rather than binary encoding, for the two multiplexers 301b and 302b. As previously described, routing multiplexers often have other numbers of input signals than eight, but an 8-to-1 multiplexer is illustrated, for simplicity and consistency with the other figures herein.

In the embodiment of FIG. 10, multiplexer 301 of FIG. 3 is implemented as shown in circuit 301b. Circuit 301b includes one N-channel transistor 1010–1017 for each input signal IL0–IL7, and provides signal INT106. Similarly, circuit 302b includes one N-channel transistor 1000–1007 for each input signal, and provides signal INT107. Eight configuration memory cells R0–R7 are provided, each controlling one N-channel transistor in each multiplexer. As indicated by the "one-hot" designation for multiplexers 301b and 302b, only one of the eight configuration memory cells R0–R7 can provide a high value at any given time, to avoid possible contention at intermediate nodes INT106 and INT107.

FIG. 11 shows one way in which the invention can be used to implement a lookup table (LUT) for a PLD. The circuit of FIG. 11 can be used, for example, in logic blocks (LBs) 801a–801i of FIG. 8. In the embodiment of FIG. 11, the input signals are provided by eight configuration memory cells M0–M7. The three select signals are provided by interconnect lines L0–L2 included in the interconnect structure of the PLD. The three input signals L0–L2 programmably select one of the eight stored values from memory cells M0–M7. (Note that many LUTs include 16 input signals and four select signals, for example. This and many other variations are easily extrapolated from the examples illustrated herein, as previously described.)

The LUT of FIG. 11 is implemented in a pseudo-differential manner similar to that of FIG. 4, for example. Thus, both high and low values from the interconnect lines are properly passed to output node OUT irregardless of a voltage drop applied to a high signal value. Note that the output circuit of FIG. 7 is utilized in the pictured embodiment, although other implementations can also be used. The multiplexers can also be implemented using one-hot encoding as in FIG. 10, or in some other manner. It will be apparent to one skilled in the art after reading this specification that the present invention can be practiced within these and other architectural variations.

Note that in the embodiment of FIG. 11 the inversion circuit is not illustrated. Instead, each memory cell M0–M7 provides both true and complement values of the stored contents of the memory cell. Thus, an additional inversion circuit is not needed.

Figure 12:
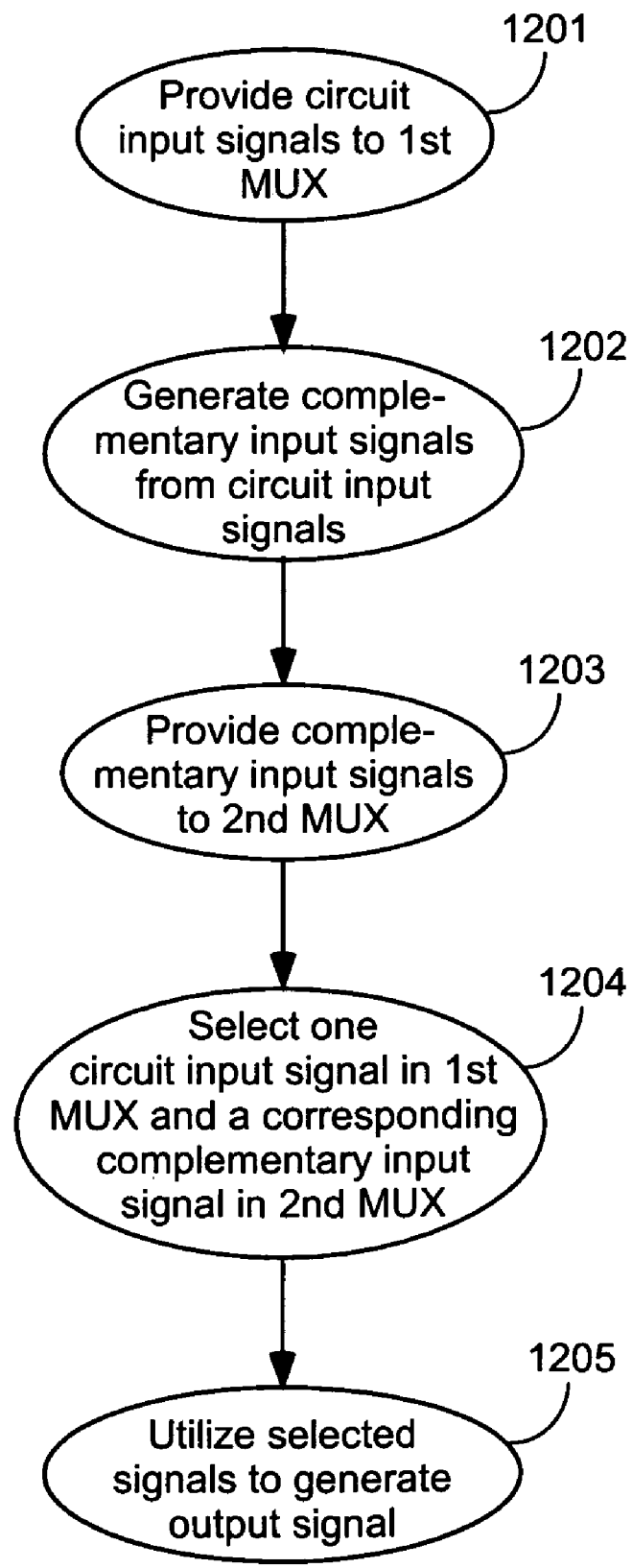
FIG. 12 illustrates the steps of a method of selecting one from a plurality of circuit input signals, according to another embodiment of the present invention.

FIG. 12 illustrates the steps of a method of selecting one from a plurality of circuit input signals, according to an aspect of the present invention. The method of FIG. 12 can be implemented, for example, by utilizing any of the circuits illustrated in FIGS. 3–7 and 9–11.

In step 1201, two or more circuit input signals are provided to a first multiplexer. In step 1202, complementary input signals are generated from the circuit input signals. Each complementary input signal has a first value (e.g., low) whenever a corresponding circuit input signal has a second value (e.g., high). In some embodiments, the complementary input signals are strict inversions of the corresponding circuit input signals. In other words, each complementary input signal always has an opposite value to the corresponding circuit input signal. In some embodiments, only the second value (e.g., high) on a circuit input signal causes the complementary signal to change to the first value (e.g., low), while the first value (e.g., low) on the circuit input signal is ignored. In step 1203, the complementary input signals are provided to a second input multiplexer.

In step 1204, one of the circuit input signals is selected in the first multiplexer, and a corresponding one of the complementary input signals is selected in the second multiplexer. In some embodiments, values stored in memory cells are used to control the selecting. One such embodiment, for example, is a routing multiplexer in a PLD, and the memory cells are configuration memory cells of the PLD. In some embodiments, the circuit input signals are stored in memory cells. In one such embodiment, the circuit implements a PLD lookup table, and the memory cells are configuration memory cells of the PLD. In step 1205, the selected signals are utilized to generate an output signal.

Those having skill in the relevant arts of the invention will now perceive various modifications and additions that can be made as a result of the disclosure herein. For example, the above text describes the circuits of the invention in the context of programmable logic devices (PLDs) such as FPGAs and CPLDs. However, the circuits of the invention can also be implemented in other integrated circuits, including non-programmable circuits as well as PLDs other than FPGAs and CPLDs. The circuits of the invention can also be implemented in electronic systems other than integrated circuits, e.g., in printed circuit boards including discrete devices.

Further, pullups, pulldowns, transistors, P-channel transistors, N-channel transistors, multiplexers, inversion circuits, inverters, buffers, output circuits, latches, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance, the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A multiplexer circuit, comprising:
    a plurality of circuit input terminals;
    a circuit output terminal;
    a first multiplexer having a plurality of input terminals coupled to the circuit input terminals, at least one select terminal, and an output terminal;
    a second multiplexer having a plurality of input terminals, at least one select terminal coupled to the at least one select terminal of the first multiplexer, and an output terminal;
    a plurality of pulldowns, each pulldown being coupled between a ground terminal and a corresponding one of the input terminals of the second multiplexer, each pulldown having a gate terminal coupled to a corresponding one of the circuit input terminals; and
    an output circuit having a first input terminal coupled to the output terminal of the first multiplexer, a second input terminal coupled to the output terminal of the second multiplexer, and an output terminal coupled to the circuit output terminal,
    wherein the first and second multiplexers are configured to select a corresponding one of their respective input terminals in response to equivalent signals received at their respective select terminals.

2. The multiplexer circuit of claim 1, further comprising at least one memory cell coupled to the select terminals of the first and second multiplexers.

3. The multiplexer circuit of claim 1, wherein:
    each of the first and second multiplexers comprises a plurality of select terminals comprising select terminal pairs; and
    the multiplexer circuit further comprises, for each select terminal pair, an inverter coupled between the two select terminals comprising the pair.

4. The multiplexer circuit of claim 1, wherein the output circuit comprises a latch.

5. The multiplexer circuit of claim 4, wherein the latch comprises first and second cross-coupled inverters.

6. The multiplexer circuit of claim 1, wherein the output circuit comprises:
    an inverter having an input terminal coupled to the output terminal of the first multiplexer and an output terminal coupled to the circuit output terminal;
    a first P-channel transistor coupled between the output terminal of the first multiplexer and a power high terminal, the P-channel transistor having a gate terminal coupled to the output terminal of the second multiplexer; and
    a second P-channel transistor coupled between the output terminal of the second multiplexer and the power high terminal, the P-channel transistor having a gate terminal coupled to the output terminal of the first multiplexer.

7. The multiplexer circuit of claim 1, wherein the output circuit comprises:
    an inverter having an input terminal coupled to the output terminal of the second multiplexer and an output terminal coupled to the output terminal of the first multiplexer; and
    a P-channel transistor coupled between the output terminal of the second multiplexer and a power high terminal, the P-channel transistor having a gate terminal coupled to the output terminal of the first multiplexer and further coupled to the circuit output terminal.

8. The multiplexer circuit of claim 1, wherein the plurality of circuit input terminals comprises eight input terminals.

9. The multiplexer circuit of claim 1, wherein the first and second multiplexers each comprise a plurality of transistors coupled in series between their respective input and output terminals, and all of the transistors consist of N-channel transistors.

10. The multiplexer circuit of claim 1, wherein the first and second multiplexers comprise binary multiplexers.

11. The multiplexer circuit of claim 1, wherein the first and second multiplexers comprise one-hot multiplexers.

12. The multiplexer circuit of claim 1, wherein the multiplexer circuit comprises a lookup table (LUT) for a programmable logic device (PLD).

* * * * *